(12) United States Patent
Caldwell et al.

(10) Patent No.: US 7,459,923 B2
(45) Date of Patent: Dec. 2, 2008

(54) PROBE INTERPOSERS AND METHODS OF FABRICATING PROBE INTERPOSERS

(75) Inventors: John Caldwell, Meridian, ID (US); Jerry McBride, Boise, ID (US); Brett Crump, Boise, ID (US); Phil Byrd, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/544,360

(22) Filed: Oct. 6, 2006

(65) Prior Publication Data

US 2007/0236233 A1 Oct. 11, 2007

Related U.S. Application Data

(62) Division of application No. 11/400,583, filed on Apr. 7, 2006.

(51) Int. Cl.
*G01R 31/02* (2006.01)
(52) U.S. Cl. .................................. 324/754; 324/761
(58) Field of Classification Search ......... 324/754–762; 439/482
See application file for complete search history.

(56) References Cited

U.S. PATENT DOCUMENTS

| 5,550,480 | A | * | 8/1996 | Nelson et al. ............... 324/754 |
| 5,613,861 | A | | 3/1997 | Smith et al. |
| 5,974,662 | A | | 11/1999 | Eldridge et al. |
| 6,378,201 | B1 | | 4/2002 | Tsukada et al. |
| 6,777,319 | B2 | | 8/2004 | Grube et al. |
| 6,853,209 | B1 | * | 2/2005 | Jovanovic et al. ............ 324/758 |
| 6,924,655 | B2 | * | 8/2005 | Kirby .......................... 324/754 |
| 6,933,738 | B2 | * | 8/2005 | Martin et al. ................. 324/758 |
| 7,047,638 | B2 | | 5/2006 | Eldridge et al. |
| 7,048,548 | B2 | | 5/2006 | Mathieu et al. |
| 2003/0098702 | A1 | * | 5/2003 | Tatematsu et al. ........... 324/757 |
| 2005/0162179 | A1 | * | 7/2005 | Hosaka et al. ............... 324/762 |

FOREIGN PATENT DOCUMENTS

| JP | 4280445 | | 10/1992 |
| JP | 04280445 | A * | 10/1992 |
| JP | 1996050146 | A | 2/1996 |
| JP | 199133062 | A | 5/1999 |

* cited by examiner

*Primary Examiner*—Vinh P Nguyen
(74) *Attorney, Agent, or Firm*—Wells St. John P.S.

(57) ABSTRACT

The invention includes probe interposers and methods of fabricating pose interposers. In one implementation, a method of fabricating a probe interposer includes providing a substrate having a frontside and a backside. Probe tips are lithographically patterned on the substrate frontside. The probe tips have electrically conductive outer ends configured to mechanically and electrically engage conductive contact surfaces of a circuit substrate to be probed. Mechanical hard stops are lithographically patterned on the substrate frontside. The mechanical hard stops have outer surfaces configured to mechanically engage some surface of the circuit substrate during probe of the circuit substrate with the probe interposer. The invention includes probe interposers independent of method of fabrication.

24 Claims, 12 Drawing Sheets

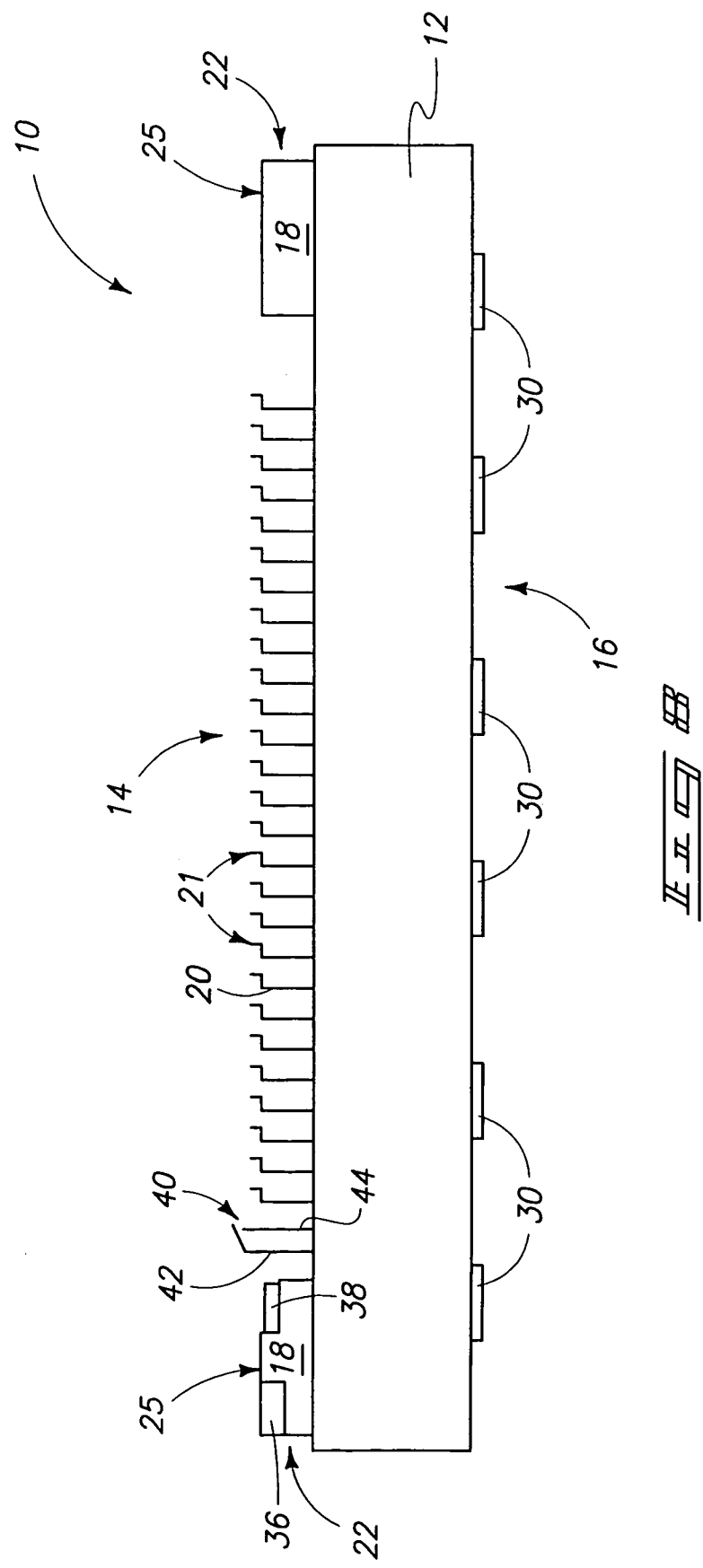

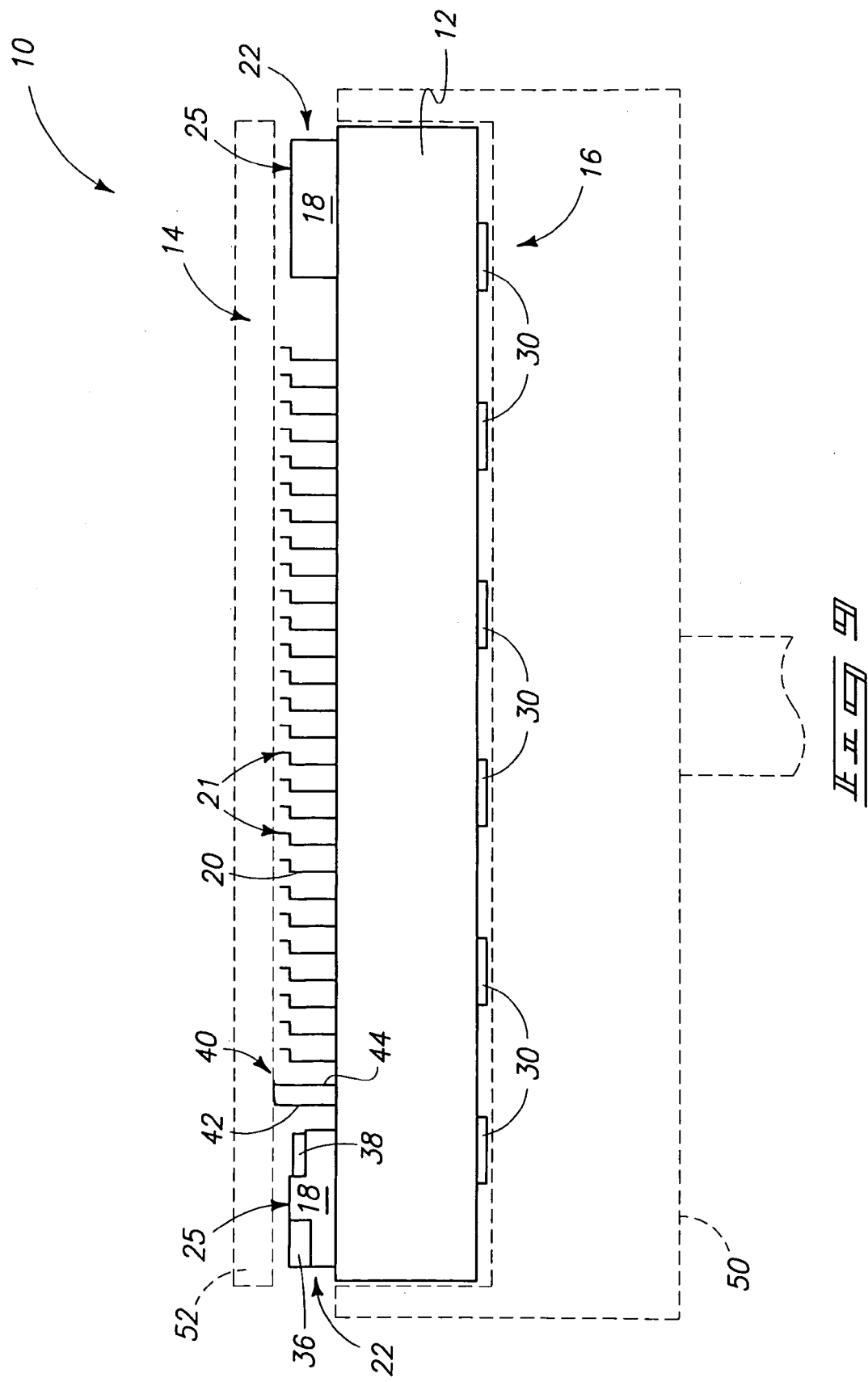

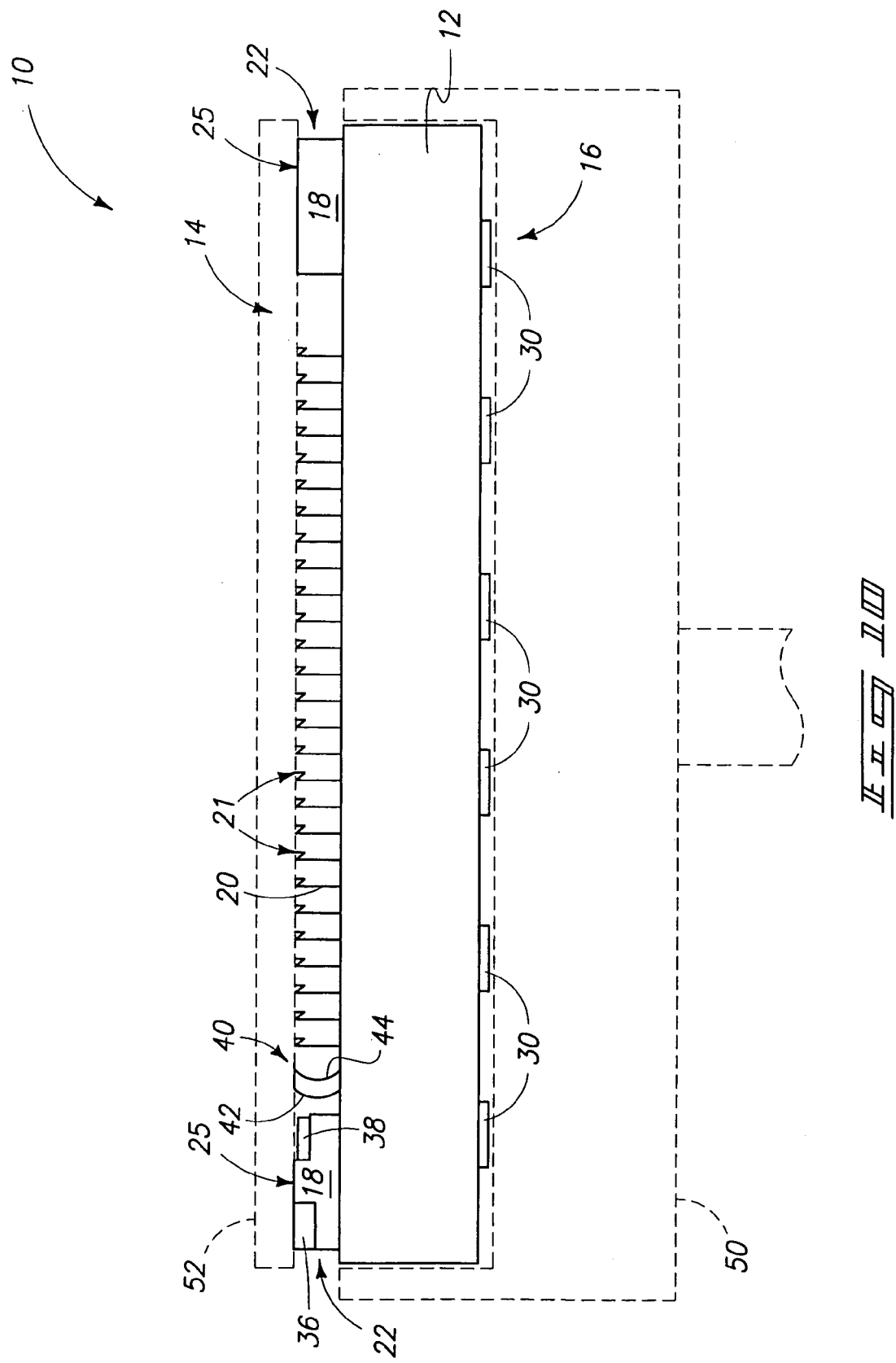

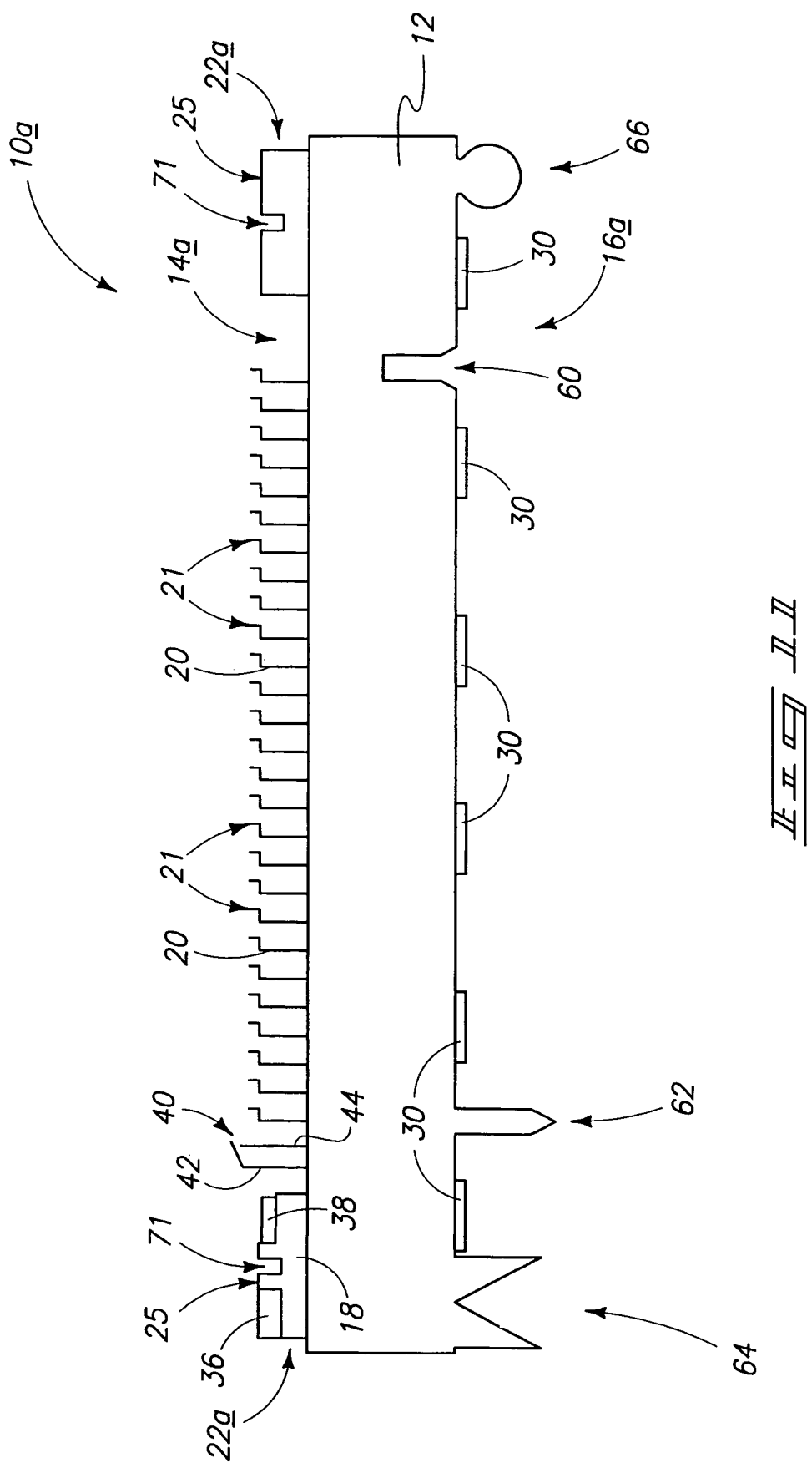

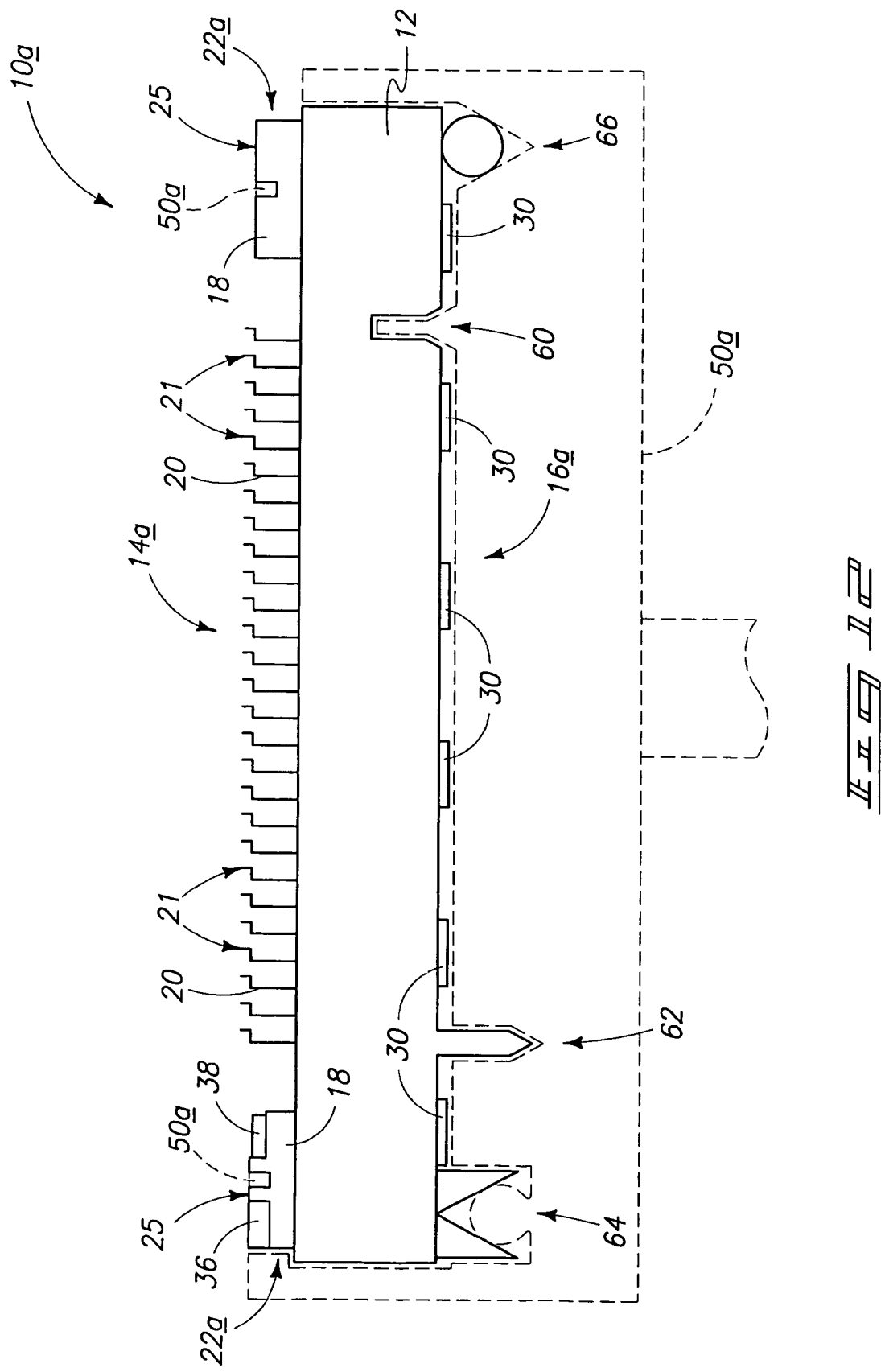

PROBE INTERPOSERS AND METHODS OF FABRICATING PROBE INTERPOSERS

RELATED PATENT DATA

This patent resulted from a divisional application of U.S. patent application Ser. No. 11/400,583, filed Apr. 7, 2006, entitled "Probe Interposers and Methods of Fabricating Probe Interposers", naming John Caldwell, Jerry McBride, Brett Crump and Phil Byrd as inventors, the disclosure of which is incorporated by reference.

TECHNICAL FIELD

This invention relates to probe cards and to probe interposers, and to methods of fabricating probe cards and probe interposers.

BACKGROUND OF THE INVENTION

Electric circuits upon fabrication are typically subjected to testing to verify operability. Some circuits are subjected to electrical and environmental stress prior to being packaged and shipped to an end user. Such testing and/or stress might occur relative to a wafer or other substrate containing a plurality of fabricated integrated circuits or die prior to singulation. Alternately by way of example only, such testing and/or stress might occur after singulation into individual die and/or in connection with such die mounted to or a part of another substrate.

Such testing and/or stress is typically conducted with a probing device, and is commonly referred to as "probe". The circuit under test is typically provided with a series of exposed electrical contacts or bond pads. These are mechanically and electrically contacted with needle-like probe tips whereupon the testing and/or stressing of the integrated circuit occurs. At the conclusion of the testing and/or stress, the integrated circuit substrate and probe tips are physically separated from one another, and the probe device is utilized to test or stress another circuit substrate.

The needle-like probe tips are typically provided on what is synonymously commonly referred to as any of a probe card, probe interposer, or probe transposer. Such physically mounts to a larger system which is capable of providing electrical stimulus through the probe card to an integrated or other electric circuit under test/stress. The probe card/interposer/transposer might alternately mount to another structure or cassette which directly mounts to the larger system which provides the desired electrical stimulus. Regardless, the probe interposer typically can be used multiple times, yet can be replaced upon damage or wear.

Existing technology, of course, relies upon very precise x, y and z-axis positioning of the substrate under test/stress relative to the probing equipment. Accordingly, the probe interposer needs to be precisely and accurately mounted relative to the system providing electrical stimulus as well as be precisely positionable relative to the integrated circuit undergoing test/stress. The probe tips must therefore be precisely aligned in x and y-axes such that they engage desired contact/bond pads on the circuit under test/stress. Further, the electric circuit substrate undergoing test/stress and the probe card must be precisely positionable along the z-axis direction (toward and away from one another) to make desired physical contact of the probe tips with the contact pads in a manner which is effective yet not damaging of either the electric circuit substrate or the probe tips. Such is, in part, presently accommodated for by making the probe tips yieldable in a spring-like manner in the z-axis direction.

Further and regardless, optical equipment might be utilized for precisely positioning the probe card and electric circuit substrate relative to one another in any of the x, y and/or z-axes. Additionally, the relative probe contacting is typically along a plane requiring that the electric circuit substrate and probe card be leveled relative to one another such that the presentation of one to the other is very close to, if not perfectly, parallel. Any degree of leveling that does not achieve essentially parallel interfacing can over-stress or damage some of the probe tips and/or contact pads of the electric circuit substrate undergoing test or stress.

While the invention was motivated in addressing the above identified issues, it is in no way so limited. The invention is only limited by the accompanying claims as literally worded, without interpretative or other limiting reference to the specification, and in accordance with the doctrine of equivalents.

BRIEF DESCRIPTION OF THE DRAWINGS

Preferred embodiments of the invention are described below with reference to the following accompanying drawings.

FIG. 8 is a view of the FIG. 6 substrate which includes additional processing.

FIG. 9 is one operational view of the FIG. 8 substrate.

FIG. 10 is another operational view of the FIG. 8 substrate.

FIG. 11 is a view of the FIG. 8 substrate which includes additional processing.

FIG. 12 is one operational view of the FIG. 11 substrate.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Aspects of the invention relate to methods of fabricating a probe interposer, and to probe interposers independent of the method of fabrication. In the context of this document, a "probe interposer" is an interconnect device to be temporarily received between and to electrically interconnect a) an electric circuit substrate being mechanically contacted and electrically probed by the probe interposer, and b) a system which is configured to provide electrical stimulus to the electric circuit substrate being electrically probed through the probe interposer. Accordingly, such a "probe interposer" is capable of repeated use with the same electric circuit substrate or with different electric circuit substrates. Further in some aspects, implementations of the invention might be considered as employing micro-electro-mechanical system structures and manufacturing techniques (MEMS). Such include the integration of micro-scale mechanical elements, sensors, actuators, and electronics on a silicon or a non-silicon-comprising substrate by micro-fabrication technology. Accordingly, MEMS is typically considered as involving micro-fabrication technology including a combination of fabrication of mechanical components and electronic components into or part of an electromechanical device or system.

Figure 1:
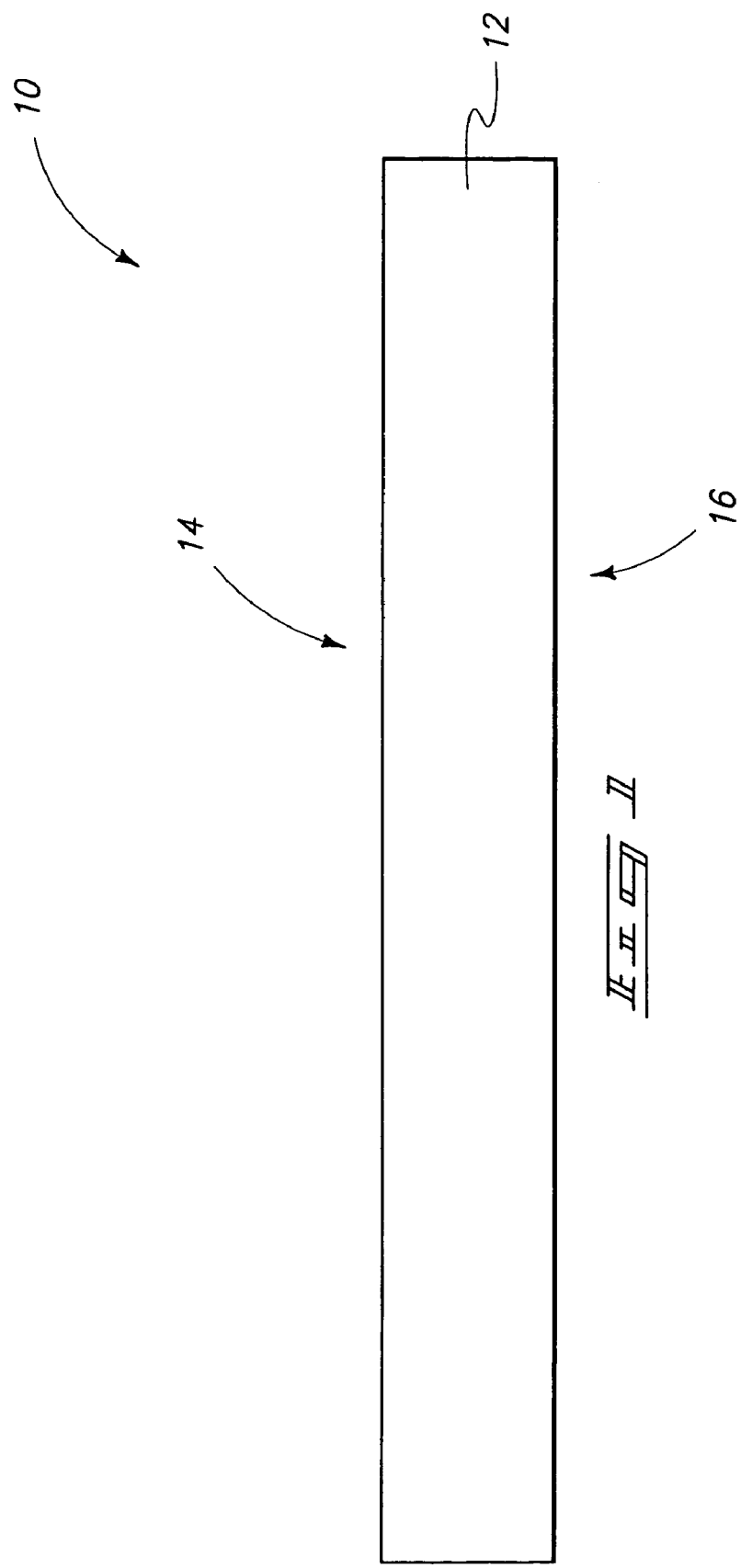
FIG. 1 is a diagrammatic sectional view of a substrate in process in accordance with an aspect of the invention.

Referring initially to FIG. 1, a substrate is indicated generally with reference numeral 10. By way of example only, such comprises a base or monolithic substrate 12, for example which may or may not comprise bulk silicon and/or semiconductor material(s). Regardless, bulk substrate 12 might be homogeneous or non-homogeneous, and/or comprise one or more different materials, layers, devices and regions formed therein or thereon. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. For purposes of the continuing discussion, substrate 10 can be considered as comprising a frontside 14 and a backside 16. Frontside 14 will be fabricated to comprise probe tips that mechanically and electrically engage an electric circuit substrate under test and/or stress.

In certain implementations, probe tips are lithographically patterned on substrate frontside 14. Such lithographic patterning, by way of example only, might include patterned deposition of material onto bulk substrate 12 and/or subtractive etching of material of bulk substrate 12 and/or material deposited upon bulk substrate 12. In one preferred implementation, the lithographic patterning of the probe tips comprises subtractively etching substrate 10 on substrate frontside 14, and which may or may not include the subtractive etching of a material deposited on substrate frontside 14 to a thickness of at least 50 Angstroms. In the context of this document, lithography is defined as a process used to transfer some pattern from a mask/reticle to a layer of imagable material (for example resist) provided on a substrate. Examples include photolithography or optical lithography, ultra-violet lithography, X-ray lithography, e-beam lithography and ion beam lithography. Additional forms of radiation exposure might also be utilized and are contemplated in the context of lithographic patterning, whether existing or yet-to-be developed.

Figure 2:
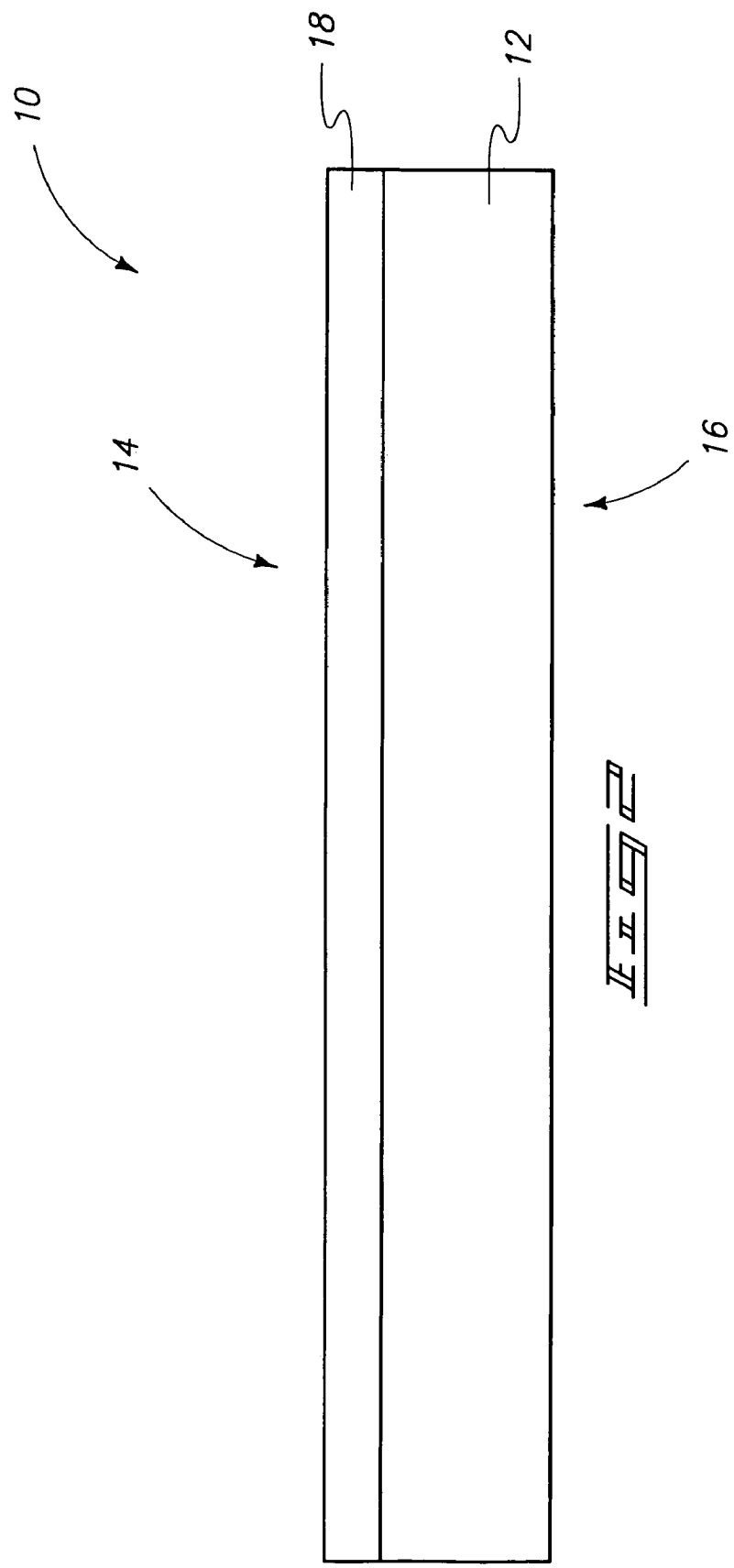
FIG. 2 is a view of the FIG. 1 substrate at a processing step subsequent to that depicted by FIG. 1.

The lithographically patterned probe tips might be of any existing or yet-to-be developed construction. By way of example only, FIG. 2 depicts a preferred implementation of fabricating probe tips wherein substrate 10 comprises one or more insulative and/or conductive material(s) 18 deposited over bulk substrate 12.

Figure 3:
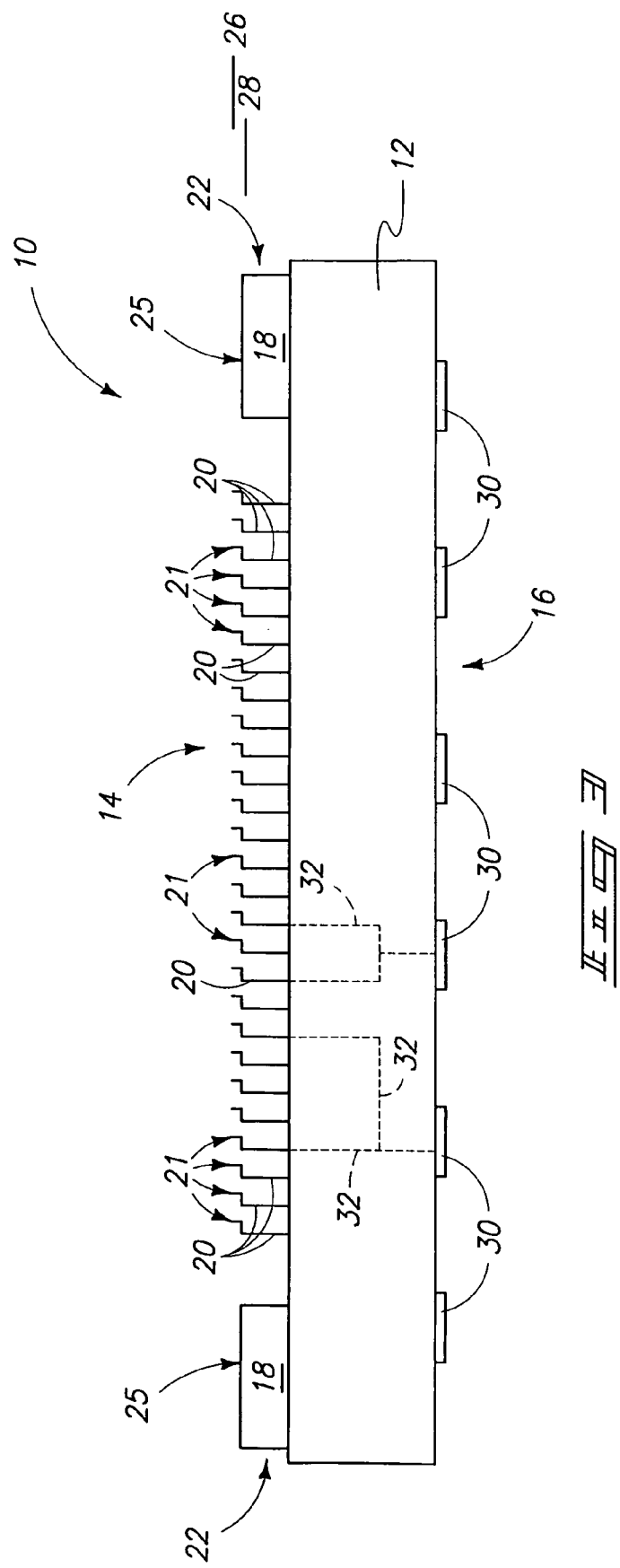
FIG. 3 is a view of the FIG. 2 substrate at a processing step subsequent to that depicted by FIG. 2.
Figure 4:
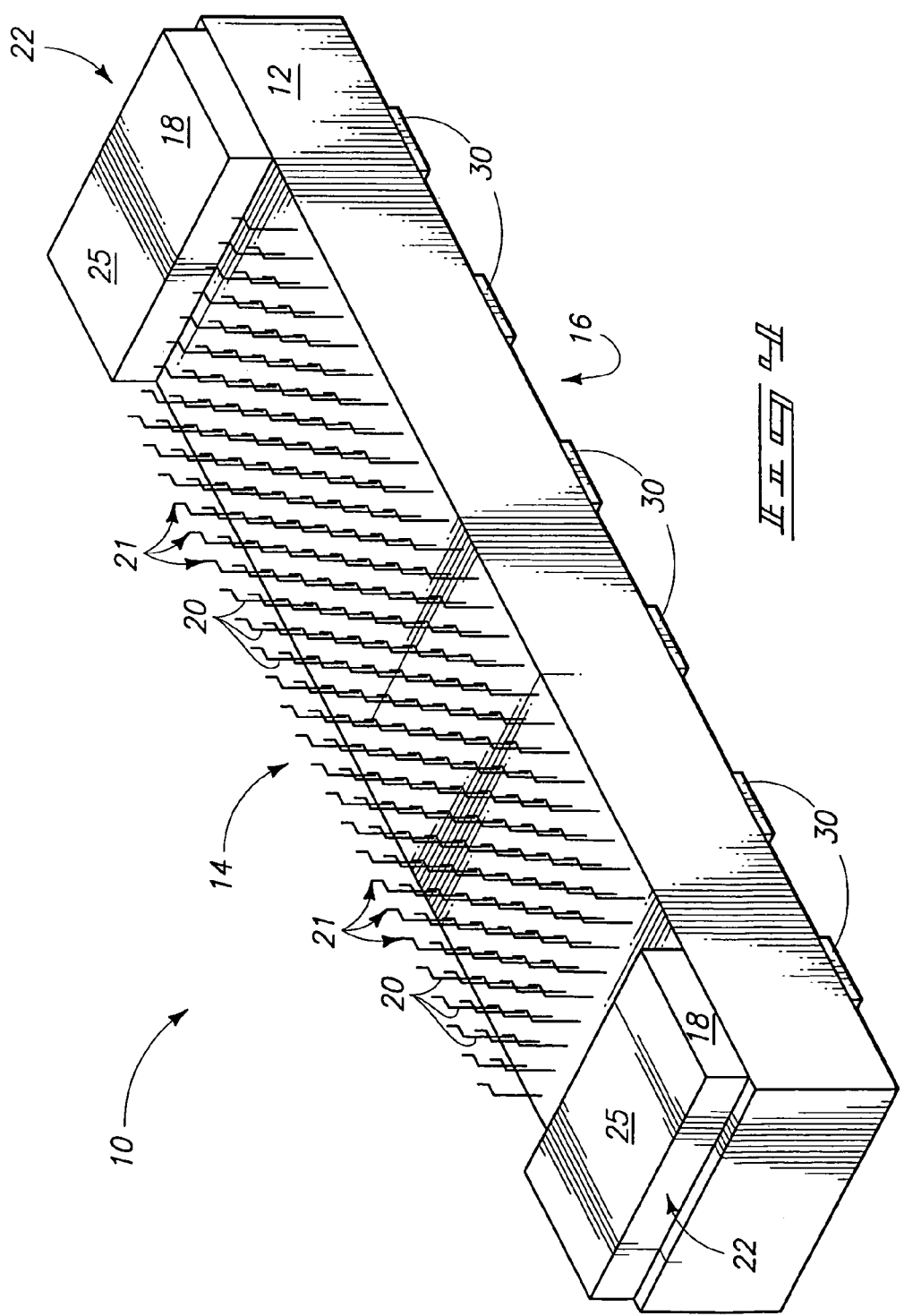
FIG. 4 is a perspective view of the FIG. 3 substrate.

FIGS. 3 and 4 depict material 18 as having been lithographically patterned on substrate frontside 14 to form a plurality of probe tips 20 on substrate frontside 14. Any suitable or yet-to-be developed probe tip construction might be lithographically patterned and fabricated, with a preferred existing cantilevered design being shown. Regardless, probe tips 20 will have electrically conductive outer ends, for example ends 21, configured to mechanically and electrically engage conductive contact surfaces of a circuit substrate to be probed by the probe interposer.

FIGS. 3 and 4 also depict, in one aspect of the invention, mechanical hard stops 22 having been lithographically patterned on substrate frontside 14. Such mechanical hard stops 22 have outer surfaces 25 which are configured to mechanically engage some surface of the circuit substrate (not shown in FIGS. 3 and 4) during the probe of the circuit substrate with the probe interposer. Lithographic patterning of the mechanical hard stops might, by way of example, comprise patterned deposition of material onto bulk substrate 12 and/or subtractive etching of material of bulk substrate 12 and/or material deposited upon bulk substrate 12. In one preferred implementation, the lithographic patterning of the mechanical hard stops comprises subtractively etching substrate 10. By way of example only in the depicted embodiment, such lithographic patterning has occurred of deposited material(s) 18. Hard stops 22 might be one or a combination of conductive, insulative, and semiconductive materials.

Probe tips 20 have been lithographically patterned to have their conductive outer end tips 21 received within a common plane 26, as would likely be typical and preferred where the contact surfaces of the circuit substrate being probed are also received within some common plane on the circuit substrate. Mechanical hard stop outer surfaces 25 are also typically, preferably, and depicted to be received within a common plane 28, also as would be typical where the surface or surfaces of the circuit substrate to be mechanically engaged thereby are received in some common plane which may or may not be exactly in the common plane within which the contact surfaces of a circuit substrate might be received. Further in the depicted preferred embodiment, outer ends 21 of probe tips 20 are received elevationally outward on substrate frontside 14 at or to a greater extent than are outer surfaces 25 of mechanical hard stops 22. An exemplary preferred difference between such elevational outer extents of the probe tip outer ends 21 and outer surfaces 25 of mechanical hard stops 22 (i.e., the distance between planes 26 and 28) is from 6 microns to 500 microns.

Probe tips 20 and mechanical hard stops 22 might be lithographically patternd utilizing one or more masking steps which are common to the fabrication of both the probe tips and the mechanical hard stops, using one or more lithographic masking steps which are not common to the fabrication of both of the probe tips and the mechanical hard stops, and perhaps including no masking steps common to the fabrication of both the probe tips and mechanical stops.

FIGS. 3 and 4 depict exemplary electrical contacts 30 formed on substrate backside 16. Such are depicted, by way of example only, as being in electrical connection with probe tips 20 by through-substrate interconnects, with but a few exemplary such interconnects being shown and indicated with reference numeral 32 in FIG. 3. Electrical contacts 30 might also be fabricated by lithographic patterning, or otherwise.

Figure 5:
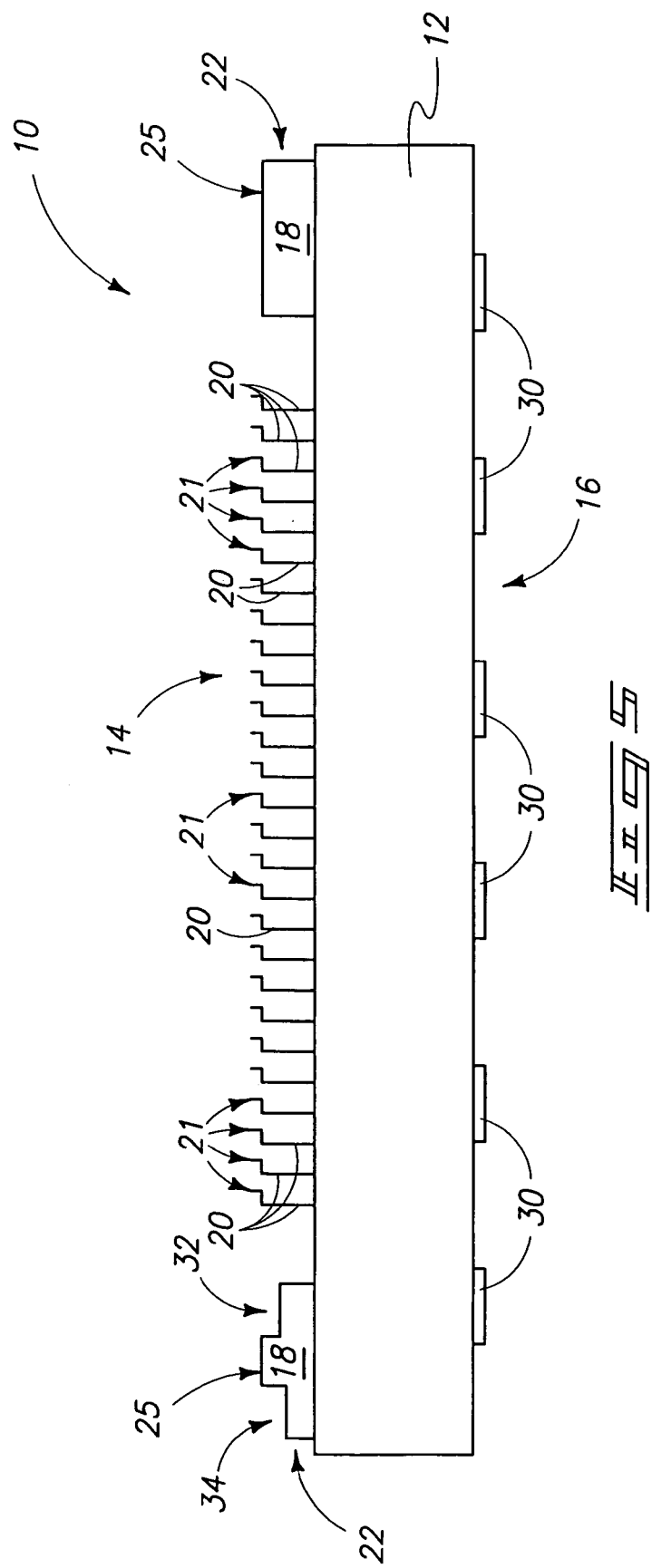
FIG. 5 is a view of the FIG. 3 substrate at a processing step subsequent to that depicted by FIG. 3.

FIG. 5 depicts exemplary additional or alternate processing relative to one of mechanical hard stops 22. Such exemplary or other processing might also occur to other or all mechanical hard stops. FIG. 5 depicts lithographic patterning having occurred to form recesses 32 and 34 within the left-depicted mechanical hard stop 22 relative to outer hard stop surface 25.

Figure 6:
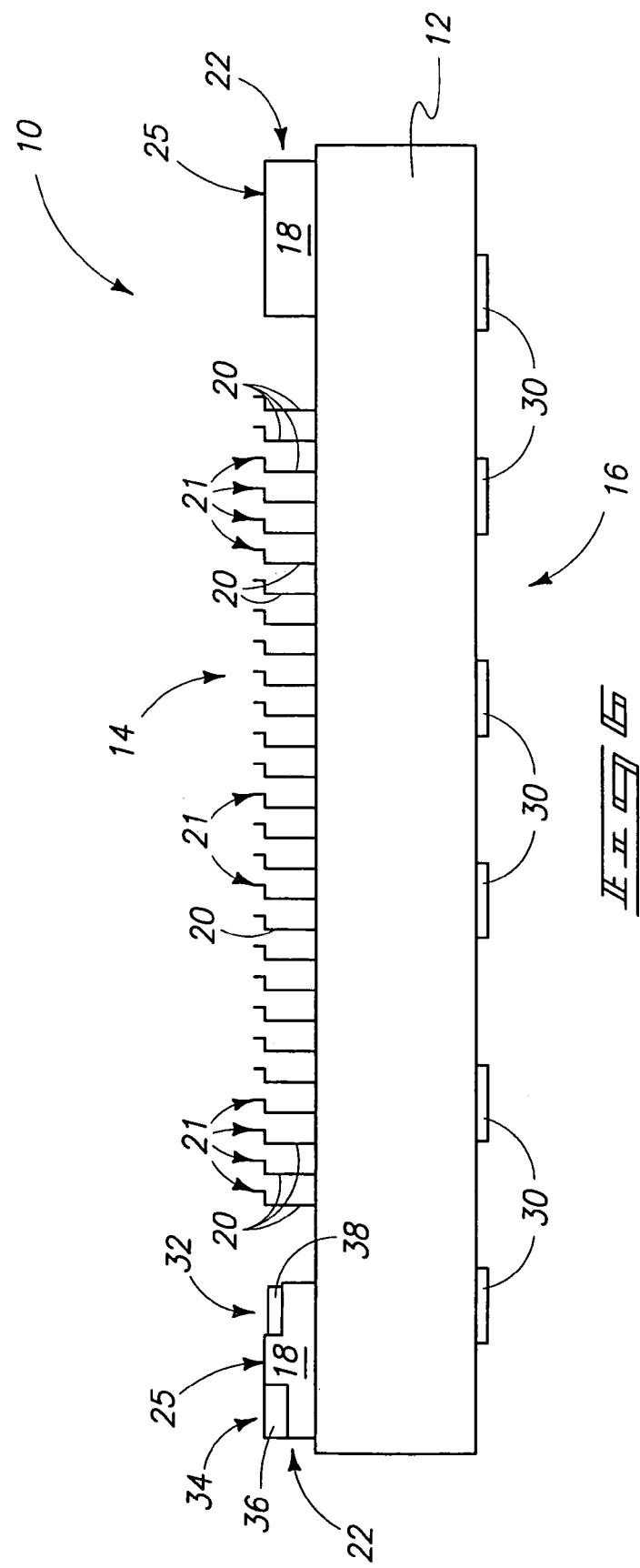
FIG. 6 is a view of the FIG. 5 substrate at a processing step subsequent to that depicted by FIG. 5.
Figure 7:
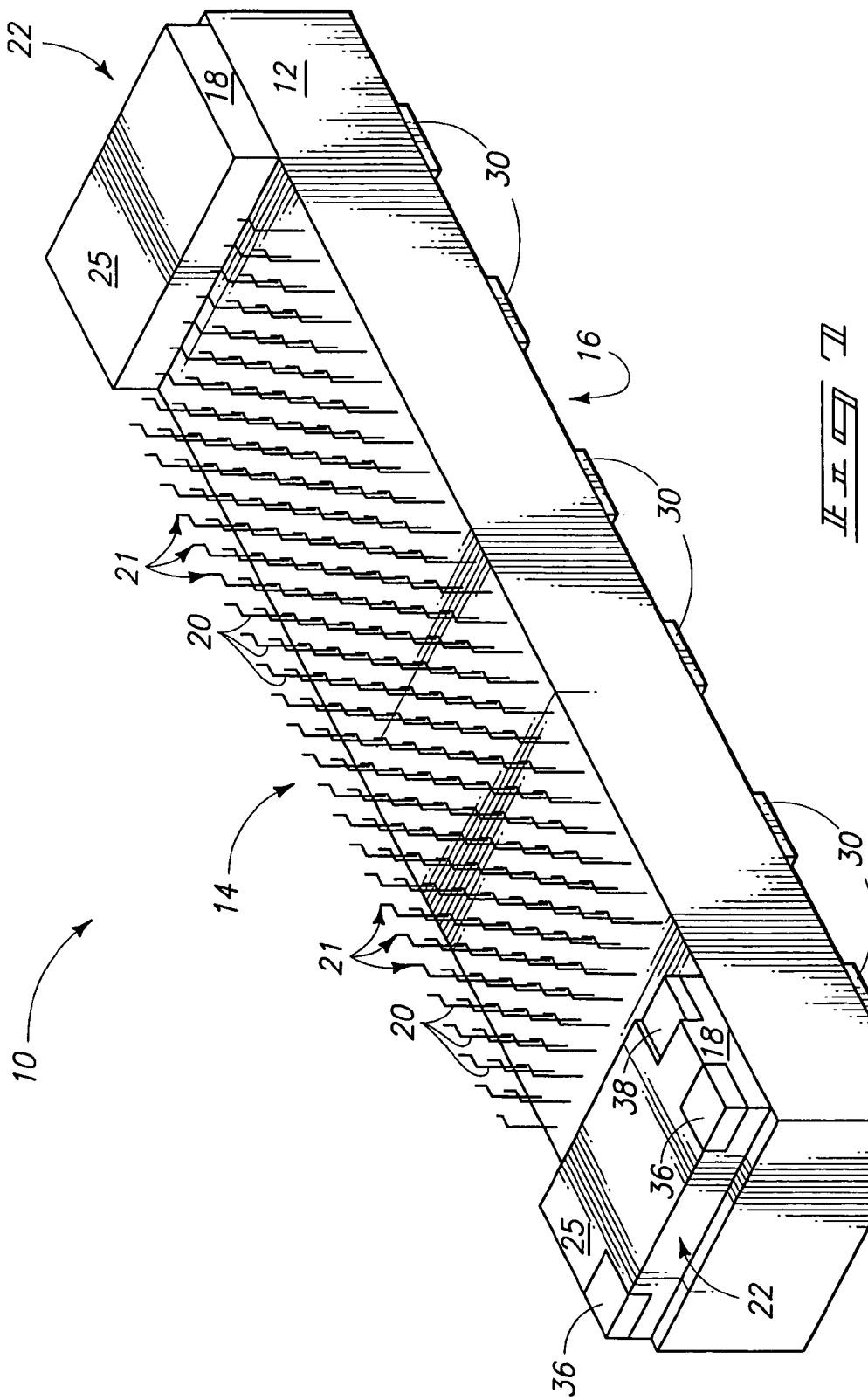
FIG. 7 is a perspective view of the FIG. 6 substrate.

FIGS. 6 and 7 depict fiducial alignment features 36 received at least partially within recesses 34. By way of example only, such might comprise a highly reflective or other contrasting material (i.e., gold or aluminum) which can be readily optically perceived by suitable optical alignment equipment. The fiducial alignment feature(s) might be provided within the recess by selective deposition, by a deposition and subtractive patterning, by a deposition and polishing, or by any other manner whether existing or yet to be developed.

FIGS. 6 and 7 also depict at least one circuit component 38 received at least partially within recess 32. Such circuit component comprises at least one of a transistor, capacitor, resistor, or diode. Of course, multiple or a combination of such devices might be so received, and form an integrated circuit or subcircuit. Component 38 might constitute or comprise a component separately fabricated from substrate 10 and physically and electrically mounted thereto subsequently. Alternately, such circuit component(s) 38 might have been lithographically patterned from material of substrate 10. Further, aspects of the invention contemplate lithographically patterning at least one such circuit component on substrate 10 (at least one of a transistor, capacitor, resistor, or diode) independent of receipt within a recess of mechanical hard stops 22 and independent of receipt on substrate frontside 14. By way of example only, such circuit component(s) might be desirable and/or form sub-circuits to be positioned very proximate the electric circuit under test/stress, as signal conditioning devices, and/or as other circuitry which may function better/more consistently if such are physically closer to the substrate under test/stress.

An aspect of the invention also contemplates a method of fabricating a probe interposer which includes lithographically patterning probe tips on the substrate frontside and lithographically patterning of a fiducial alignment feature on the substrate frontside, where such alignment feature comprises some structure other than any of the probe tips, and independent of whether the fiducial alignment feature is received within a recess of a mechanical hard stop, and, further, independent of whether any mechanical hard stop is fabricated relative to the substrate frontside. Such method of fabricating a probe interposer might include at least one lithographic masking step which is common to the fabrication of both of the probe tips and the fiducial alignment feature, and/or might comprise at least one lithographic masking step which is not common to the fabrication of both of the probe tips and the fiducial alignment feature. In one preferred implementation, the lithographically patterning of the fiducial alignment feature might comprise subtractively etching of the substrate, including by way of example deposition of a material over some base substrate to a thickness of at least 50 Angstroms, and subtractively etching of the deposited material.

An aspect of a method of fabricating a probe interposer in accordance with one implementation includes lithographically patterning probe tips on the substrate frontside and lithographically patterning at least one circuit component on the substrate, wherein the circuit component comprises at least one of a transistor, capacitor, resistor, or diode, and independent of the fabrication of a fiducial alignment feature and/or independent of fabricating a mechanical hard stop on the substrate frontside. Circuit components other than transistors, capacitors, resistors or diodes might, of course, be fabricated in any of the above embodiments.

In one implementation, a method of fabricating a probe interposer comprises lithographically patterning probe tips on the substrate frontside and lithographically patterning a z-axis detection mechanism on the substrate frontside. The z-axis detection mechanism extends elevationally outward on the substrate frontside a greater distance than the probe tips extend elevationally outward on the substrate frontside. FIG. 8 depicts such an exemplary z-axis detection mechanism 40 fabricated relative to substrate 10 in connection with the first exemplary described embodiment. A single z-axis detection mechanism 40 is depicted, although more might also be included on substrate frontside 14. In the depicted FIG. 8 example, z-axis detection mechanism 40 comprises an electromechanical switch comprising a first member 42 and a second member 44. At least one of the first and second members (member 42 in the depicted example) is capable of repeating movement towards and away from the other of the first and second members (member 44 in the depicted example) for making mechanical in the depicted example, is depicted as being biased to an open position for the switch.

A method of fabricating a probe interposer including a combination of lithographically patterning probe tips on the substrate frontside and a z-axis detection mechanism on the substrate frontside can be conducted independent of or in combination with any of the above exemplary described lithographical patterning of mechanical hard stops and/or fiducial alignment features, and/or at least one circuit component on the substrate. Further and regardless, the lithographic patternings might include at least one lithographic masking step which is common to the fabrication of both of the probe tips and the z-axis detection mechanism, and/or at least one lithographic masking step which is not common to the fabrication of both of the probe tips and the z-axis detection mechanism. Further and by way of example only, the lithographic patterning of the z-axis detection mechanism might comprise subtractive etching of the substrate, including for example subtractive etching of material deposited to a thickness of at least 50 Angstroms on the substrate. A z-axis detection mechanism might be utilized to detect when the probe interposer is displaced from the circuit substrate under test/stress, and/or relative z-axis positioning of the probe interposer as such comes into proximity with a circuit substrate to be tested/stressed.

FIG. 9 diagrammatically depicts the probe interposer 10 of the exemplary FIG. 8 embodiment in one exemplary operational orientation. A system which receives the probe interposer, and that is configured to provide electrical stimulus to an electric circuit substrate being electrically probed through the probe interposer, is diagrammatically shown and indicated with reference numeral 50. An electric circuit substrate to be mechanically contacted and electrically probed by the probe interposer is diagrammatically shown and indicated with reference numeral 52. Probe interposer 10 and electric circuit substrate 52 are shown brought into z-axis proximity relative to one another such that z-axis alignment mechanism 40 has been contacted and actuated by a surface of electric circuit substrate 52.

FIG. 10 depicts further movement of probe interposer 10 and electric circuit substrate 52 towards one another in z-axis proximity such that the electrically conductive outer ends of the probe tips mechanically and electrically engage with conductive contact surfaces (not shown) of electric circuit substrate 52, and some outer facing surface(s) of substrate 52 engage surfaces 25 of hard stops 22.

In one implementation or aspect, a method of fabricating a probe interposer comprises lithographically patterning probe tips on the substrate frontside and lithographically patterning a probe interposer mechanical mount feature on the substrate backside. In the context of this document, a probe interposer mechanical mount feature is some feature on the probe interposer which provides some form of a male/female-like mechanical interconnection relative to at least one of x, y and/or z-axes of the probe interposer relative to a system which is configured to provide electrical stimulus to the electric circuit substrate, or some support component for the probe interposer which mounts to such a system. Accordingly, such will include some sort of projection and/or indentation relative to a probe interposer. Such may be on one or some combination of the frontside, backside, or side edges of the probe interposer, and most likely will at least be on the backside.

FIG. 11 diagrammatically depicts exemplary mechanical mount features which might be encompassed in one or more embodiments (by way of example only). Like numerals from the first described embodiment are utilized where appropriate, with differences being indicated with the suffix "a", or with different numerals. Specifically, substrate/interposer 10a of FIG. 11 is depicted as comprising a substrate backside opening or indentation 60, and a substrate backside projection 62 which are ideally formed lithographically during the same step or series of steps when the probe tips are lithographically patterned. Corresponding projections and indentations would be provided relative to a component or system which receives interposer 10a for matedly receiving and engaging mechanical mount features 60 and 62. Substrate backside 16a in FIG. 11 is also depicted as comprising exemplary additional mechanical mount features 64 and 66 which would be received by complementary shaped/designed components of the electrical stimulus system, or a component which mounts to the electrical stimulus system. Further, substrate frontside 14a is depicted as comprising exemplary mechanical mount features 71 received relative to mechanical hard stops 22a (i.e., perhaps in the form of elongated trenches which also extend to outermost lateral edges of hard stops 22a, and which are not shown/visible in the FIG. 11 cross section).

FIG. 12 depicts such an exemplary alternate system 50a (operatively analogous to system 50) which engages probe interposer 10a.

Aspects of the invention also contemplate probe interposers independent of manufacture. Further, methodical and non-methodical interposer aspects of the invention encompass and contemplate any one or more combinations of the various above-stated features and/or methods.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A probe interposer comprising:
a substrate comprising a frontside and a backside;
probe tips on the substrate frontside, the probe tips having electrically conductive outer ends configured to mechanically and electrically engage conductive contact surfaces of a circuit substrate to be probed; and
mechanical hard stops on the substrate frontside, the mechanical hard stops having outer surfaces configured to mechanically engage some surface of the circuit substrate during probe of the circuit substrate with the probe interposer, at least one of the mechanical hard stops comprising a recess formed therein relative its outer surface and which extends only partially into the at least one mechanical hard stop from its outer surface.

2. A probe interposer comprising:
a substrate comprising a frontside and a backside;
probe tips on the substrate frontside, the probe tips having electrically conductive outer ends configured to mechanically and electrically engage conductive contact surfaces of a circuit substrate to be probed;
mechanical hard stops on the substrate frontside, the mechanical hard stops having outer surfaces configured to mechanically engage some surface of the circuit substrate during probe of the circuit substrate with the probe interposer; and
multiple fiducial alignment features received on an individual of the mechanical hard stops, said individual of the mechanical hard stops comprising multiple recesses formed therein relative to its outer surface, individual of the multiple fiducial alignment features being received within individual of said multiple recesses.

3. The probe interposer of claim 2 wherein said multiple recesses extend only partially into said individual of the mechanical hard stops from its outer surface.

4. A probe interposer comprising:
a substrate comprising a frontside and a backside;
probe tips on the substrate frontside, the probe tips having electrically conductive outer ends configured to mechanically and electrically engage conductive contact surfaces of a circuit substrate to be probed; and
a z-axis detection mechanism on the substrate frontside, the z-axis detection mechanism extending elevationally outward on the substrate frontside a greater distance than the probe tips extend elevationally outward on the substrate frontside.

5. The probe interposer of claim 4 wherein the z-axis detection mechanism is normally open.

6. The probe interposer of claim 4 wherein the z-axis detection mechanism comprises an electromechanical switch comprising a first member and a second member, at least one of the first and second members being repeatably moveable towards and away from the other of the first and second members for making mechanical contact with the other to close and open said switch, said at least one of the first and second members being biased to an open position.

7. The probe interposer of claim 4 comprising only a single z-axis detection mechanism.

8. The probe interposer of claim 4 comprising multiple of said z-axis detection mechanisms.

9. The probe interposer of claim 4 comprising mechanical hard stops on the substrate frontside, the mechanical hard stops having outer surfaces configured to mechanically engage some surface of the circuit substrate during probe of the circuit substrate with the probe interposer, the z-axis detection mechanism extending elevationally outward on the substrate frontside a greater distance than the mechanical hard stops extend elevationally outward on the substrate frontside.

10. A probe interposer comprising:
a substrate comprising a frontside and a backside;
probe tips on the substrate frontside, the probe tips having electrically conductive outer ends configured to mechanically and electrically engage conductive contact surfaces of a circuit substrate to be probed; and
mechanical hard stops on the substrate frontside, the mechanical hard stops having outer surfaces configured to mechanically engage some surface of the circuit substrate during probe of the circuit substrate with the probe interposer, at least one of the mechanical hard stops comprising multiple recesses formed therein relative its outer surface.

11. The probe interposer of claim 10 wherein said multiple recesses extend only partially into the at least one of the mechanical hard stops from its outer surface.

12. A probe interposer comprising:
a substrate comprising a frontside and a backside;
probe tips on the substrate frontside, the probe tips having electrically conductive outer ends configured to mechanically and electrically engage conductive contact surfaces of a circuit substrate to be probed; and
mechanical hard stops on the substrate frontside, the mechanical hard stops having outer surfaces configured to mechanically engage some surface of the circuit substrate during probe of the circuit substrate with the probe interposer, at least one of the mechanical hard stops comprising a recess formed therein relative its outer surface, a circuit component received within the recess.

13. The probe interposer of claim 12 wherein the circuit component is received within the recess entirely inwardly of the outer surface.

14. The probe interposer of claim 12 wherein said recess extends only partially into the at least one of the mechanical hard stops from its outer surface.

15. A probe interposer comprising:
a substrate comprising a frontside and a backside;
probe tips on the substrate frontside, the probe tips having electrically conductive outer ends configured to mechanically and electrically engage conductive contact surfaces of a circuit substrate to be probed; and
mechanical hard stops on the substrate frontside, the mechanical hard stops having outer surfaces configured to mechanically engage some surface of the circuit substrate during probe of the circuit substrate with the probe interposer, at least one of the mechanical hard stops comprising a recess formed therein relative its outer surface, an integrated circuit received within the recess.

16. The probe interposer of claim 15 wherein the integrated circuit is received within the recess entirely inwardly of the outer surface.

17. The probe interposer of claim 15 wherein said recess extends only partially into the at least one of the mechanical hard stops from its outer surface.

18. A probe interposer comprising:
a substrate comprising a frontside and a backside;
probe tips on the substrate frontside, the probe tips having electrically conductive outer ends configured to mechanically and electrically engage conductive contact surfaces of a circuit substrate to be probed;
mechanical hard stops on the substrate frontside, the mechanical hard stops having outer surfaces configured to mechanically engage some surface of the circuit substrate during probe of the circuit substrate with the probe interposer; and
a fiducial alignment feature received on at least one of the mechanical hard stops, at least one of the mechanical hard stops comprising a recess formed therein relative its outer surface, the fiducial alignment feature being received within the recess.

19. The probe interposer of claim 18 wherein said recess extends only partially into the at least one of the mechanical hard stops from its outer surface.

20. A probe interposer comprising:
a substrate comprising a frontside and a backside;
probe tips on the substrate frontside, the probe tips having electrically conductive outer ends configured to mechanically and electrically engage conductive contact surfaces of a circuit substrate to be probed; and
mechanical hard stops on the substrate frontside, the mechanical hard stops having outer surfaces configured to mechanically engage some surface of the circuit substrate during probe of the circuit substrate with the probe interposer, at least one of the mechanical hard stops comprising a mechanical mount feature, the mechanical mount feature comprising a recess formed relative the outer surface, the recess comprising an elongated trench, the mechanical hard stop in which the elongated trench is received comprising outermost lateral edges, the elongated trench extending to the outermost lateral edges.

21. A probe interposer comprising:
a substrate comprising a frontside and a backside;
probe tips on the substrate frontside, the probe tips having electrically conductive outer ends configured to mechanically and electrically engage conductive contact surfaces of a circuit substrate to be probed; and
mechanical hard stops on the substrate frontside, the mechanical hard stops having outer surfaces configured to mechanically engage some surface of the circuit substrate during probe of the circuit substrate with the probe interposer, at least one of the mechanical hard stops comprising a recess formed therein relative its outer surface, the mechanical hard stop in which the recess is received comprising outermost lateral edges, the recess extending to at least one of said outermost lateral edges.

22. The probe interposer of claim 21 wherein the recess extends to at least two of said outermost lateral edges.

23. The probe interposer of claim 21 wherein the recess extends only partially into the at least one of the mechanical hard stops from its outer surface.

24. The probe interposer of claim 23 wherein the recess extends to at least two of said outermost lateral edges.

* * * * *

UNITED STATES PATENT AND TRADEMARK OFFICE
CERTIFICATE OF CORRECTION

PATENT NO.        : 7,459,923 B2  
APPLICATION NO.   : 11/544360  
DATED             : December 2, 2008  
INVENTOR(S)       : Caldwell et al.

Page 1 of 1

It is certified that error appears in the above-identified patent and that said Letters Patent is hereby corrected as shown below:

In column 1, line 9, delete "Caldwell," and insert -- Caldwell, --, therefor.

Signed and Sealed this

Third Day of February, 2009

JOHN DOLL  
*Acting Director of the United States Patent and Trademark Office*